(12) United States Patent
Vyssotski et al.

(10) Patent No.: US 6,700,339 B2
(45) Date of Patent: Mar. 2, 2004

(54) CIRCUIT FOR REGULATING A POWER SUPPLY VOLTAGE

(75) Inventors: Nikolai V. Vyssotski, Elgin, TX (US); Christian L. Critz, Georgetown, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 10/157,294

(22) Filed: May 29, 2002

(65) Prior Publication Data

US 2003/0222608 A1 Dec. 4, 2003

(51) Int. Cl.[7] .................. H02K 23/00; H02M 3/335; H02M 1/12; H02P 5/28
(52) U.S. Cl. .................. 318/254; 318/138; 318/439; 318/599; 318/799; 318/811; 363/26; 363/41; 388/811; 388/819
(58) Field of Search ................ 318/254, 138, 318/439, 599, 799, 806, 808, 811; 363/26, 41, 47; 388/811, 819, 829, 831

(56) References Cited

U.S. PATENT DOCUMENTS

| | | | | | |
|---|---|---|---|---|---|
| 5,513,361 A | * | 4/1996 | Young | ................ | 713/320 |
| 5,625,269 A | * | 4/1997 | Ikeda | ................ | 318/696 |
| 5,687,079 A | * | 11/1997 | Bauer et al. | ................ | 700/70 |
| 5,825,972 A | * | 10/1998 | Brown | ................ | 388/811 |
| 5,848,282 A | * | 12/1998 | Kang | ................ | 713/323 |
| 5,881,298 A | * | 3/1999 | Cathey | ................ | 713/324 |
| 5,898,288 A | * | 4/1999 | Rice et al. | ................ | 318/685 |
| 5,942,866 A | * | 8/1999 | Hsieh | ................ | 318/268 |
| 6,008,603 A | * | 12/1999 | Jones et al. | ................ | 318/254 |
| 6,054,823 A | * | 4/2000 | Collings et al. | ........... | 318/439 |
| 6,188,189 B1 | * | 2/2001 | Blake | ................ | 318/471 |
| 6,259,172 B1 | * | 7/2001 | Lee | ................ | 307/125 |
| 6,285,146 B1 | * | 9/2001 | Harlan | ................ | 318/254 |

OTHER PUBLICATIONS

"Fan Speed Control is Cool !"; http://www.maxim-ic.com/appnotes.cfm/appnote_number/707; Feb. 2, 2001.*

* cited by examiner

Primary Examiner—Robert Nappi
Assistant Examiner—Edgardo San Martin
(74) Attorney, Agent, or Firm—Baker Botts L.L.P.

(57) ABSTRACT

Disclosed is a circuit for regulating a power supply. In one embodiment, the circuit includes a signal generator for generating a square wave signal that varies in magnitude between a first voltage and a second voltage, and a voltage regulation circuit. A duty cycle of the square wave generated by the signal generator varies according to a signal provided to the signal generator. The voltage regulation circuit, coupled to the signal generator, outputs a DC voltage in response to the circuit receiving the square wave signal. The magnitude of the DC voltage varies between the first voltage and a third voltage, wherein the third voltage is greater than the second voltage, and wherein the magnitude of the DC voltage varies directly with the duty cycle of the square wave signal.

21 Claims, 3 Drawing Sheets

CIRCUIT FOR REGULATING A POWER SUPPLY VOLTAGE

BACKGROUND OF THE INVENTION

Information handling systems play a vital role in our modern society. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated.

The variations in information handling systems allow for information handling systems to be general or configured for a specific user or specific use such as financial transaction processing, airline reservations, enterprise data storage, or global communications. In addition, information-handling systems may include a variety of hardware and software components that may be configured to process, store, and communicate information and may include one or more computer systems, data storage systems, and networking systems.

A computer system, which is one common type of information handling system, may be designed to give independent computing power to one or a plurality of users. Computer systems may be found in many forms including, for example, mainframes, minicomputers, workstations, servers, clients, personal computers, Internet terminals, notebooks, personal digital assistants, and embedded systems.

Information handling systems often include components that require a regulated power supply. FIG. 1 illustrates relevant components of an information handling system 10 having a CPU 12 coupled to a memory 14 that stores instructions executable by the microprocessor. Information handling system 10 includes an electric fan motor 16 that turns a fan blade (not shown) for cooling the CPU 12 during operation thereof. CPUs require active cooling to operate in a thermal envelope recommended by the manufacturer thereof. Fans are the preferred means for maintaining CPU temperature within the recommended thermal envelope. Ideally, the maximum airflow (fan is fully on) provides the best cooling results. However, it is desirable to be able to gradually vary the fan speed according to the cooling needs in order to save power. Additionally, reducing fan speed reduces acoustic noise produced by the cooling fan. The fan speed can be varied by varying the voltage provided to the power input node of the electric fan motor 16.

Fan speed depends on the magnitude of voltage provided to motor 16. Information handling system 10 includes a circuit for regulating the power provided to electric fan motor 16. The circuit includes a power management circuit (PMC) 18 and power field effect transistor (FET) 20 coupled between the electric motor 16 and PMC 18. More particularly, the output of PMC 18 is coupled to a gate-input node of FET 20. The source node of FET 20 is coupled to a first power supply having a voltage VCC1, while a drain node of FET 20 is coupled to a power input node of motor 16.

PMC 18 generates a square wave signal, the duty cycle of which depends upon a control signal provided to PMC 18. FIG. 2 illustrates an exemplary square wave generated by PMC 18. The square wave shown in FIG. 2 varies between VCC2, the voltage of a second power supply provided to PMC 18 in FIG. 1, and ground. VCC2 may be distinct from VCC1. The first power supply is capable of providing high current power to fan motor 16 when compared to the current that is provided by the second power supply. As noted above, the duty cycle depends upon the control signal provided to PMC 18. The period of square wave shown in FIG. 2 remains constant notwithstanding a change in the duty cycle in response to a change in the control signal provided to PMC 18.

The square wave signal generated by PMC 18 is provided to the gate-input node of power FET 20. When the voltage of the square wave signal is at VCC1, FET 20 activates thereby coupling the first power supply to the power-input node of fan motor 16. In response, a shaft (not shown) of motor 16 rotates thereby turning a fan blade (not shown) which in turn produces airflow over microprocessor 12. When the voltage of the square wave signal provided to the input gate of FET 20 is at or near ground, FET 20 turns off thereby disconnecting the first power supply from the input node of fan motor 16. In response, the rotational speed of the motor shaft begins to slow and may even stop until FET 20 is again activated by the square wave.

The rotational speed of the fan motors' shaft depends upon the duty cycle of the square wave provided to FET 20. The higher the duty cycle the higher the average rotational speed of the shaft. To obtain the highest average rotational speed, the duty cycle of the square wave should be 100%. With a 0% duty cycle, no power is provided to fan motor 16, and the shaft thereof does not rotate. For duty cycles between 0 and 100%, the average rotational speed of the motors' shaft varies accordingly.

The constant coupling and decoupling of the first power supply to the power input node of fan motor 16 according to the square wave provided to the gate input node of FET 20, stresses fan motor 16 such that fan motor 16 may eventually and prematurely fail. Additionally, the constant coupling and decoupling of first power supply to fan motor 16 corrupts logic within motor 16 that generates a tachometer output signal of fan motor 16 which may be used to determine whether rotational speed of the shaft is set at a desired rate.

SUMMARY OF THE INVENTION

Disclosed is a circuit for regulating a power supply. In one embodiment, the circuit includes a signal generator for generating a square wave signal that varies in magnitude between a first voltage and a second voltage, and a voltage regulation circuit. A duty cycle of the square wave generated by the signal generator varies according to a signal provided to the signal generator. The voltage regulation circuit, coupled to the signal generator, outputs a DC voltage in response to the circuit receiving the square wave signal. The magnitude of the DC voltage varies between the first voltage and a third voltage, wherein the third voltage is greater than the second voltage, and wherein the magnitude of the DC voltage varies directly with the duty cycle of the square wave signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Disclosed is a circuit for generating DC voltage in response to receiving a square wave signal. The magnitude of the DC voltage varies according to the duty cycle of the square wave signal. The DC voltage may be provided to an input node of a electrical or electronic device. For purposes of explanation, the present invention will be described with reference to a circuit for generating and providing a DC voltage to a power-input node of a fan motor contained within an information handling system, it being understood that the present invention should not be limited thereto.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, finctionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
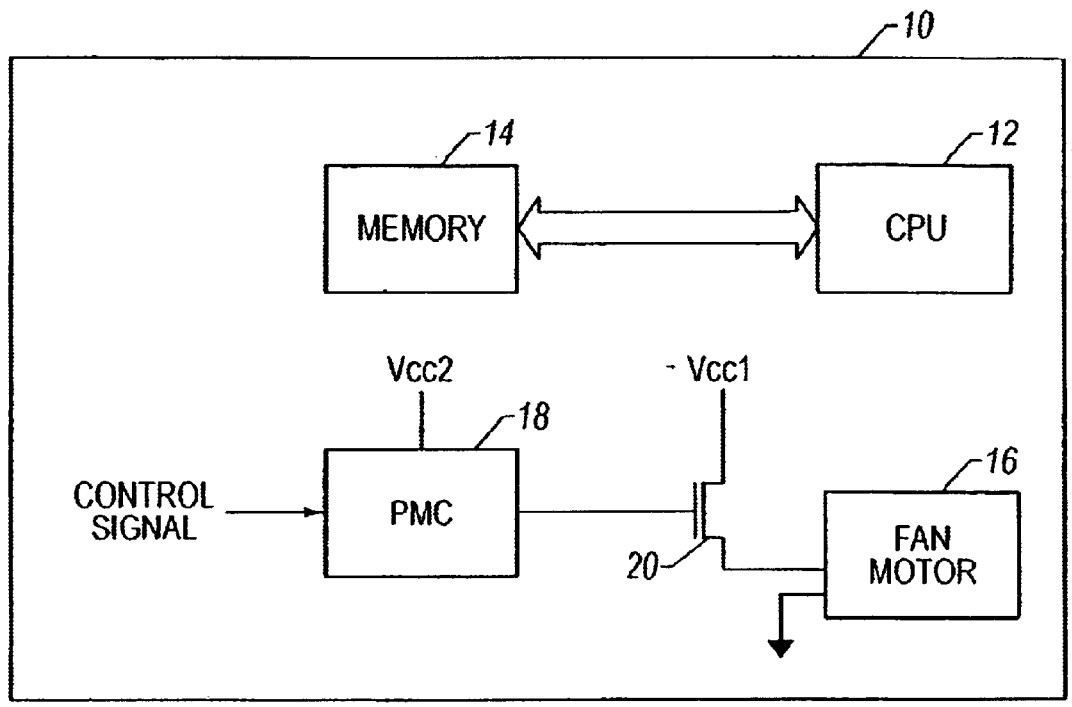
FIG. 1 is a block diagram of a prior art information handling system.
Figure 2:
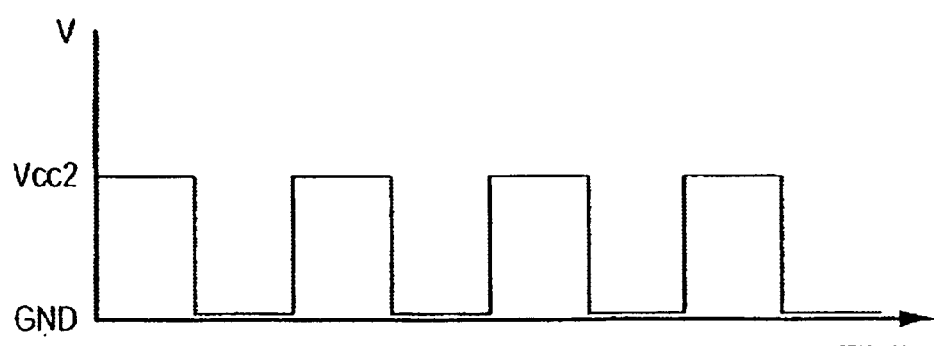
FIG. 2 illustrates an exemplary square wave signal generated by the power management controller of FIG. 1.
Figure 3:
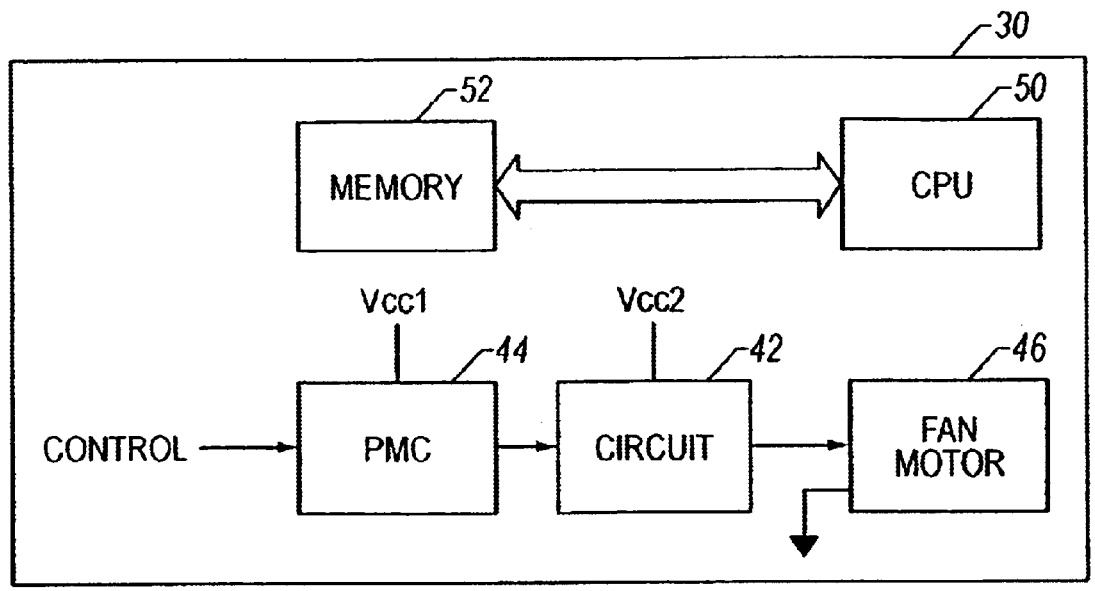
FIG. 3 is a block diagram illustrating relevant components of an information handling system employing the present invention.

FIG. 3 shows relevant components of an information handling system 30 including a circuit 42 coupled between a PMC 44 and a power-input node of electric fan motor 46. Additionally, FIG. 3 also shows a CPU 50 coupled to a memory 52 that stores instructions executable by CPU 50. Although not shown, fan motor 46 includes a shaft that rotates a fan blade (not shown). The rotating fan blade provides a stream of cooling air for cooling CPU 50. The volume of air measured in a given period of time that flows over CPU 50 depends upon the average rotational speed of the shaft during that given period of time. The average rotational speed of the fan motor shaft during the given period of time depends upon the average magnitude of voltage provided to the power-input node thereof.

Figure 4:
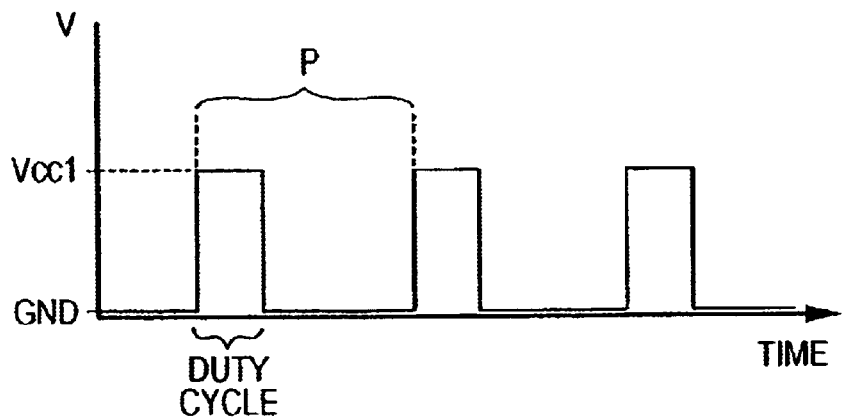
FIG. 4 illustrates an exemplary square wave signal generated by the power management controller of FIG. 3.

PMC 44 generates a square wave signal that is provided to an input node of circuit 42. FIG. 4 illustrates an exemplary square wave provided by PMC 44. The voltage of the square wave varies in magnitude from ground to VCC1, the voltage of a first power supply provided to PMC 44. The duty cycle for the square wave shown in FIG. 4 is controlled by a control signal provided to PMC 44. The duty cycle can range from 0% to 100% of the period P of the square wave signal. The square wave of FIG. 4 is shown with an approximately 33% duty cycle.

Circuit 42 is coupled to receive the square wave signal generated by PMC 44. In response, circuit 42 outputs a voltage to a power-input node of fan motor 46. The voltage output of circuit 42 will have a direct current (DC) component. The output voltage of circuit 42 may also have a few low frequency components. However, the voltage magnitude of the low frequency components (if any) of the output of circuit 42 will be substantially low when compared to the voltage magnitude of the DC component. Even if the output of circuit 42 includes low frequency components, the output of circuit will not vary between ground and a positive voltage as in the prior art and thus will not cause the fan motor 46 to eventually and prematurely fail as a result of being turned on and off at a high frequency. For purposes of explanation, it will be presumed that the output of circuit 42 will include no non-zero frequency voltage components.

In one embodiment, the voltage output of circuit 42 varies between ground and VCC2, the voltage of a second power supply provided to circuit 42. In one embodiment, VCC2 is greater in magnitude than VCC1. In another embodiment, VCC1 and VCC2 are equal in magnitude. Indeed, circuit 42 and PMC 44 can be coupled to the same power supply. However, the fan motor 46 generally requires greater current then that needed to drive the digital logic of PMC 44. For purposes of explanation, PMC 44 and circuit 42 are coupled to the first and second power supplies, respectively, as shown, with VCC2 greater than VCC1. Additionally, the second power supply provides more current to circuit 42 when compared to the first power supply.

Fan motor 46, receives the DC voltage generated by circuit 42 at its power-input node. In response, fan motor 46 rotates its shaft. The speed at which fan motor 46 rotates its shaft depends upon the magnitude of the voltage provided by circuit 42. The higher the voltage, the faster the shaft of fan motor 46 turns.

Figure 5:
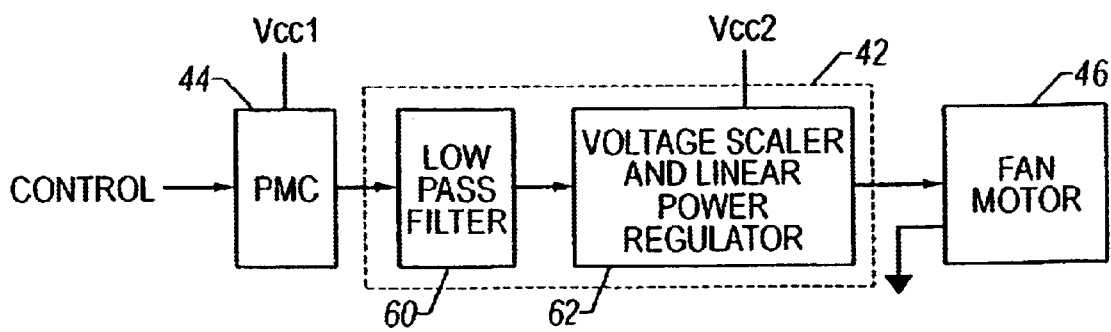
FIG. 5 is a block diagram illustrating relevant components of one embodiment of the circuit shown FIG. 3.

FIG. 5 illustrates one embodiment of circuit 42 shown in FIG. 3. More particularly, circuit 42 shown in FIG. 5 includes a low pass filter 60 coupled to voltage scaler and linear power regulator circuit 62. Low pass filter 60 receives the square wave from PMC 44. In response low pass filter produces a signal which, in turn, is provided to circuit 62. The signal generated by low pass filter 60 will have a DC component. The signal generated by low pass filter 60 may also have a few low frequency components. However, the voltage magnitude of the low frequency components (if any) of the signal generated by low pass filter 60 will be substantially low when compared to the voltage magnitude of the DC component. For purposes of explanation, it will be presumed that the signal generated by low pass filter 60 will not include any non-zero frequency components.

The voltage of the DC signal generated by a low pass filter 60 varies between ground and VCC1. Moreover, the magnitude of the DC signal output of low pass filter 60 depends upon the duty cycle of the square wave provided by PMC 44. The duty cycle is defined as 100% multiplied by W/P where W is the amount of time the square wave is on during each period P of the square wave. The DC signal produced by low pass filter 60 varies linearly from ground, when the duty cycle of the square wave is 0%, to VCC1 when the duty cycle of the square wave is 100%. For example, the DC signal output of low pass filter 60 will have a magnitude of VCC1/2 when the duty cycle and the square wave is 50%.

In one embodiment circuit 62 scales the DC signal generated by filter 60. Additionally, circuit 62 regulates the voltage provided to the input node of motor 46 in accordance with the scaled DC signal. VCC2, as noted above, may be different than VCC1 in magnitude. For purposes of explanation it will be presumed that VCC2 is greater than VCC1.

The magnitude of the voltage provided to the input node of fan motor 46 depends upon the magnitude of the scaled DC signal. More particularly, the magnitude of the voltage provided to the power input node of fan 46 varies linearly from ground, when the scaled DC signal is ground, to VCC2, when the scaled DC signal is at its maximum value. Importantly, the voltage provided to fan motor 46 varies with the duty cycle of the square wave generated by PMC 44. Thus, the magnitude of the voltage provided to fan motor 46 varies linearly from ground when the duty cycle is 0% to VCC2 when the duty cycle is 100%.

Figure 6:
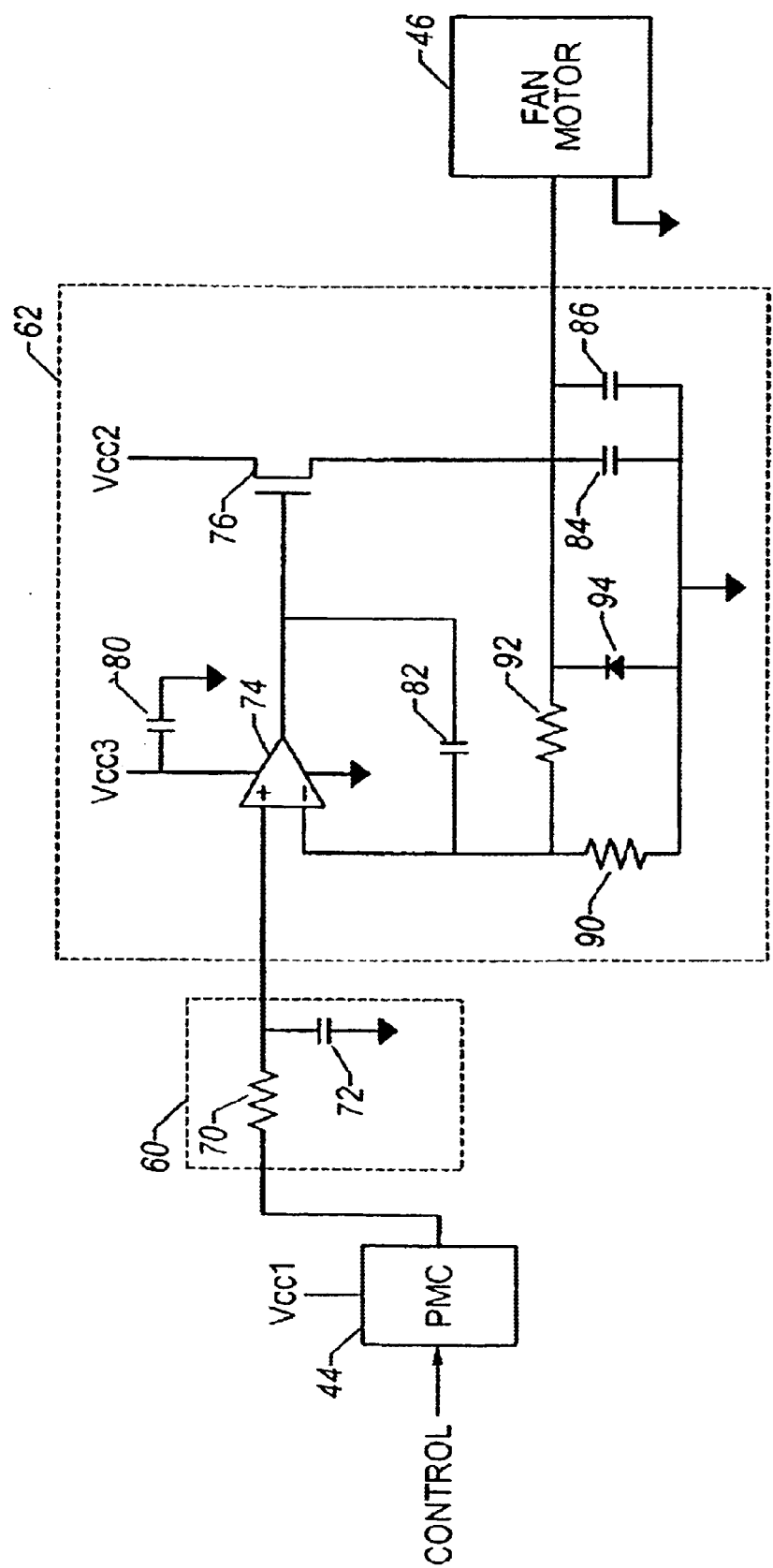
FIG. 6 is a schematic diagram illustrating relevant components of one embodiment of the low pass filter and the voltage scaler and linear power regulator shown in FIG. 5.

FIG. 6 illustrates relevant components of one embodiment of the low pass filter 60 shown in FIG. 5. More particularly, FIG. 6 shows low pass filter 60 consisting of a resistor 70 coupled to a capacitor 72. As shown in FIG. 6, resistor 70 is coupled between input and output nodes of low pass filter 60. It is noted that the input node of low pass filter 60 is coupled to the output node of PMC 44. Capacitor 72 is coupled between the output node of low pass filter 60 and ground.

The input node of low pass filter 60 receives the square wave signal generated by PMC 44. In response, low pass filter 60 provides the DC signal at its output node. Again, the voltage magnitude of the DC signal provided by low pass filter 60 is dependent upon the duty cycle of the square wave signal input.

FIG. 6 also illustrates relevant components of one embodiment of circuit 62. More particularly, circuit 62 is shown to include an operational amplifier 74 coupled between the output of low pass filter 60 and a power transistor 76. For purposes of explanation, power transistor 76 will take form in a FET, it being understood that the present invention should not be limited thereto. For example, power transistor 76 could take form in a bipolar junction transistor (BJT). A non-inverting input node of amplifier 74 is coupled to the output of low pass filter 60, while the output of amplifier 74 is coupled to the gate input node of power FET 76. Circuit 62 also includes capacitors 80–86, resistors 90 and 92, and diode 94. Amplifier 74 is coupled to a third power supply having a voltage VCC3 which, in one embodiment, is greater in magnitude than the voltage VCC2 of the second power supply. Capacitor 80 is coupled between third power supply and ground. Capacitor 82 is coupled between the output node of amplifier 74 and the inverting input of amplifier 74. The source of FET 76 is coupled to the second power supply while the drain of FET 76 is coupled to the input power node of fan motor 46. Additionally, capacitors 84 and 86 (which could be combined into a single capacitor) along with diode 94 are coupled in parallel to each other and between the input node of fan motor 46 and ground. Resistor 92 is coupled between the inverting input node of amplifier 74 and the input node of fan motor 46, while resistor 90 is coupled between the inverting input of amplifier 74 and ground.

Amplifier 74 operating in conjunction with one or more of components 80–94, generates the scaled DC signal mentioned above. This scaled DC signal is provided to the gate input node of power FET 76. Power FET 76 conducts current to the power input node of fan motor 46 when active. The voltage at which current is provided to the fan motor 46 depends upon the magnitude of the scaled DC signal provided to the gate input node of FET 76. More particularly, the voltage provided to fan motor 46 varies linearly from ground when the scaled DC voltage at the output of amplifier 74 is ground, to VCC2 when the voltage at the output at amplifier 74 is a threshold voltage below VCC1.

FIGS. 5–6 illustrate one embodiment of circuit 42 shown in FIG. 3. In an alternative embodiment where VCC1 is equal to VCC2, the low pass filter 60 shown in FIG. 6 may be coupled directly between PMC 44 and power FET 76 without any additional components 74, and 80–94 or only a few of the additional components 74, and 80–94.

Although the present invention has been described in connection with several embodiments, the invention is not intended to be limited to the specific forms set forth herein, but on the contrary, it is intended to cover such alternatives, modifications, and equivalents as can be reasonably included within the scope of the invention as defined by the appended claims.

What is claimed is:

1. An information handling system, comprising:
   a microprocessor for executing instructions stored in a memory coupled thereto;
   a fan for cooling said microprocessor during operation thereof, said fan comprising a fan motor and a fan blade coupled to a shaft of said fan motor, wherein the shaft rotation speed is proportionate to a variable direct current (DC) voltage level applied to said fan motor;
   a voltage regulator coupled between said fan motor and a first DC power source, said voltage regulator controlling the variable DC voltage level applied to said fan motor, wherein the DC voltage level applied to said fan motor can be any voltage from about ground to about the first DC power source voltage;
   a power management controller having a speed control pulse output; and
   a pulse-to-DC voltage converter, said pulse-to-DC voltage converter coupled between the speed control pulse output of said power management controller and a control input of said voltage regulator, whereby said power management controller controls said fan motor shaft speed.

2. The information handling system of claim 1, wherein said voltage regulator comprises a power field effect transistor.

3. The information handling system of claim 2, wherein said voltage regulator further comprises an operational amplifier coupled to the power field effect transistor.

4. The information handling system of claim 1, wherein said pulse-to-DC voltage converter is a low pass filter.

5. The information handling system of claim 4, wherein the low pass filter comprises a resistor and a capacitor.

6. The information handling system of claim 5, wherein the resistor is coupled between input and output nodes, and the capacitor is coupled between the output node and a ground node, whereby the input node receives square wave signals from the speed control pulse output of said power management controller, and the output node produces a DC control signal to the control input of said voltage regulator.

7. The information handling system of claim 1, wherein said power management controller is coupled to a second power source.

8. The information handling system of claim 7, wherein said pulse-to-DC voltage converter is coupled to a third power source.

9. The information handling system of claim 8, wherein the first DC voltage source has a higher current rating than the second voltage source.

10. The information handling system of claim 8, wherein the first DC voltage source has a higher current rating than the third voltage source.

11. The information handling system of claim 8, wherein the second DC voltage source is at a higher voltage than the first voltage source.

12. The information handling system of claim 8, wherein the second DC voltage source is at a higher voltage than the third voltage source.

13. The information handling system of claim 8, wherein the first DC voltage source, the second voltage source and the third voltage source are at approximately the same voltage.

14. The information handling system of claim 8, wherein the first DC voltage source, the second voltage source and the third voltage source are one common voltage source.

15. An apparatus for controlling fan speed, comprising:
   a fan motor having a shaft speed proportionate to a variable direct current (DC) voltage level applied to said fan motor,
   a voltage regulator coupled between said fan motor and a first DC power source, said voltage regulator controlling the variable DC voltage level applied to said fan motor, wherein the DC voltage level can be any voltage from about ground to about the first DC power source voltage;
   a power management controller having a speed control pulse output; and
   a pulse-to-DC voltage converter, said pulse-to-DC voltage converter coupled between the speed control pulse output of said power management controller and a control input of said voltage regulator, whereby said power management controller controls said fan motor shaft speed.

16. The apparatus of claim 15, wherein said pulse-to-DC voltage converter is a low pass filter.

17. The apparatus of claim 16, wherein the low pass filter comprises a resistor and a capacitor.

18. A method for controlling a fan motor having a shaft rotation speed dependent upon a variable direct current (DC) voltage level applied to said fan motor, said method comprising the steps of:
   generating a plurality of speed determining pulses, wherein a characteristic of the plurality of speed determining pulses represents a desired fan motor shaft rotation speed;
   converting the plurality of speed determining pulses into a variable DC voltage representative of the desired fan motor shaft rotation speed, wherein the DC voltage can be any voltage from about ground to a maximum voltage level; and
   applying the variable DC voltage to the fan motor.

19. The method of claim 18, where the step of generating a plurality of speed determining pulses is done with a power management controller.

20. The method of claim 18, where the step of converting the plurality of speed determining pulses into a DC voltage is done with a pulse-to-DC voltage converter.

21. The method of claim 18, where the step of applying the variable DC voltage to the fan motor is done with a voltage regulator.

* * * * *